(12) United States Patent
Jang

(10) Patent No.: US 6,194,287 B1
(45) Date of Patent: Feb. 27, 2001

(54) SHALLOW TRENCH ISOLATION (STI) METHOD WITH REPRODUCIBLE ALIGNMENT REGISTRATION

(75) Inventor: Syun-Ming Jang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/285,916

(22) Filed: Apr. 2, 1999

(51) Int. Cl.$^7$ .................................................. H01L 21/76
(52) U.S. Cl. ..................... 438/427; 438/424; 438/401; 438/633
(58) Field of Search ................................ 438/401, 424, 438/427, 633

(56) References Cited

U.S. PATENT DOCUMENTS

| | | | |
|---|---|---|---|
| 5,346,584 | 9/1994 | Nasr et al. | 156/636 |
| 5,401,691 * | 3/1995 | Caldwell | 438/427 |
| 5,494,854 | 2/1996 | Jain | 437/195 |
| 5,578,519 | 11/1996 | Cho | 437/67 |
| 5,691,215 * | 11/1997 | Dai et al. | 438/401 |
| 5,702,567 * | 12/1997 | Mitsu et al. | 438/401 |
| 5,702,977 | 12/1997 | Jang et al. | 437/67 |
| 5,705,320 | 1/1998 | Hsu et al. | 430/313 |
| 5,721,173 * | 2/1998 | Yano et al. | 438/424 |
| 5,728,621 | 3/1998 | Zheng et al. | 438/427 |
| 5,872,042 * | 2/1999 | Hsu et al. | 438/401 |
| 5,925,575 * | 7/1999 | Tao et al. | 438/692 |
| 5,963,816 * | 10/1999 | Wang et al. | 438/401 |
| 6,020,249 * | 1/2000 | Shih et al. | 438/401 |
| 6,043,133 * | 3/2000 | Jang et al. | 438/401 |
| 6,080,636 * | 6/2000 | Tseng | 438/401 |
| 6,080,659 * | 6/2000 | Chen et al. | 438/633 |

* cited by examiner

*Primary Examiner*—Charles Bowers
*Assistant Examiner*—David S Blum
(74) *Attorney, Agent, or Firm*—George O. Saile; Stephen B. Ackerman (57) ABSTRACT

A method for forming within a substrate employed within a microelectronics fabrication a planarized trench fill layer employed to fill trenches formed within the substrate, while retaining alignment marks also formed within the substrate, by selectively etching the trench fill layer from alignment mark and from the oxide dielectric-layer regions over the mesas between the trenches formed within the substrate. After the trench fill layer is planarized, an oxide dielectric reverse-tone mask pattern is employed to form the patterned photomask for selective etching of the trench fill layer from the alignment mark and the oxide dielectric-layer mesa regions. The method of the invention affords additional protection of the alignment marks due to the presence of the overlying trench fill layer during planarization of the trench fill layer.

17 Claims, 5 Drawing Sheets

SHALLOW TRENCH ISOLATION (STI) METHOD WITH REPRODUCIBLE ALIGNMENT REGISTRATION

BACKGROUND OF THE INVENTION

1. Field of the Invention

The invention relates to the field of manufacture of microelectronics fabrications employing photolithographic methods. More particularly, the invention relates to a method for retaining of alignment marks upon a microelectronics substrate when filling trenches formed within the substrate.

2. Description of the Related Art

The manufacture of microelectronics fabrications is accomplished by repetitive performance of photolithographic operations of mask pattern generation and pattern formation, employing additive or subtractive processes to form the microelectronics patterned layers which make up a microelectronics fabrication. These patterned layers must be accurately aligned with a previously formed patterned layer or layers. This is accomplished by providing within each photomask pattern a series of alignment marks to permit accurate positioning of the entire pattern to previously formed patterns. This is done via alignment of photomask alignment marks with corresponding substrate alignment marks. Alignment marks within substrates are commonly simple line or space structures whose sharply defined edges or steps are the reference points for pattern to pattern alignment wherein the sharply defined edges may be sensed by methods such as laser interferometry to provide accurate location data for positioning the overlying photolithographic patterns.

In many instances, the manufacturing steps and materials employed in microelectronics fabrications may fill in, cover over or otherwise obscure the alignment marks of a particular pattern, making subsequent pattern alignment difficult. One such example occurs when filling trenches within microelectronics substrates such as semiconductor integrated circuit microelectronics substrates. Such trench fling is generally done with microelectronics layers formed over and upon the substrate. Often such trench fill layers are planarized after formation, and the underlying substrate alignment marks are obliterated. Another example is the employment of a silicon nitride layer as an etch stop layer underneath other layers which are to be removed by etching or etching combined with mechanical polishing. It is desirable to employ a silicon nitride layer as thin as practicable to aid in retaining surface planarity. However, very thin silicon nitride layers may not afford adequate protection against etch penetration and damage to underlying alignment marks protected with only the thin silicon nitride layer.

It is an important aspect of microelectronics fabrication to be able to form isolation trenches within substrates and fill them with gap filling trench fill material layers formed over the substrate, but it is equally important to be able to align patterns using registration alignment marks formed upon the substrates.

It is therefore towards the goal of filling trenches within microelectronics substrates while retaining alignment registration marks on the substrate that the present invention is generally directed.

It is in addition towards the goal of providing a method for filling isolation trenches within semiconductor substrates employed within integrated circuit microelectronics fabrications while retaining alignment registration marks on the semiconductor substrate after planarization that the present invention is more specifically directed.

Various methods have been disclosed in the art of microelectronics fabrication for filling trenches within substrates within microelectronics fabrication and/or for preserving alignment mark integrity within microelectronics substrates when forming layers over those microelectronics substrates.

For example, Nasr et al., in U.S. Pat. No. 5,346,584, disclose a method for forming planarized trench isolation regions within trenches within semiconductor integrated circuit substrates. The method employs patterned polysilicon filler blocks formed within depressions over trenches filled with a conformal silicon oxide layer, which are then annealed to fill the depressions with expanded silicon oxide masses formed from the polysilicon filler blocks. The surface is then planarized by a chemical mechanical polish (CMP) method.

Further, Jain, in U.S. Pat. 5,494,854, discloses a method for forming a planarized inter-level dielectric layer interposed between patterns of a patterned conductor layers within a microelectronics fabrication. The method employs a high density plasma chemical vapor deposition (HDP-CVD) method for planarizing at least the high aspect ratio pattern followed by deposition of a sacrificial silicon oxide layer and chemical mechanical polish (CMP) planarization.

Yet further, Cho et al., in U.S. Pat. No. 5,578,519, disclose a method for forming a planarized surface on a gap filling dielectric layer employed to fill shallow isolation trenches within a microelectronics substrate while restoring access to alignment marks on the substrate. The method employs selective subtractive etching of portions of the gap filling dielectric layer followed by planarizing the surface of the remaining gap filling dielectric layer.

Yet still further, Jang et al., in U.S. Pat. No. 5,702,977, disclose a method for forming within a trench within a substrate a trench fill layer which is subsequently chemical mechanical polish (CMP) planarized without dishing within the area of the filled trench. The method employs a deposition inhibiting initial layer formed upon the regions of the substrate which do not have trenches formed therein and a deposition enhancing layer over those regions which do have trenches formed therein. The resulting differences in topography of the trench fill dielectric overlayer aid in subsequent planarization.

Still yet further, Hsu et al., in U.S. Pat. No. 5,705,320, disclose a method for keeping alignment mark and laser identity mark areas within microelectronics substrates clear after planarization of inter-level dielectric overlayers formed over the alignment marks areas. The method realizes the object by forming clearout window areas in the frame portions of the mask reticle. Thus the necessity for additional photomask operations to maintain accessibility to the alignment marks and identity marks is obviated.

Yet still further, Yano et al., in U.S. Pat. 5,721,173, disclose a method for forming and filling shallow isolation trenches within a semiconductor microelectronics substrate. The method forms trenches by etching through a silicon nitride pattern layer on a semiconductor microelectronics substrate and fills the trenches employing a silicon oxide dielectric layer. The silicon oxide dielectric layer is then covered with an etch resistant polysilicon layer which is selectively patterned to allow subsequent etching of the silicon oxide layer away from the trench areas. The etch resistant polysilicon layer is then selectively removed to form a planarized surface. The silicon nitride pattern layer for forming isolation trenches may be replaced by a polysilicon layer in a second embodiment.

Finally, Zheng et al., in U.S. Pat. 5,728,621, disclose a method for forming shallow isolation trenches within a semiconductor microelectronics substrate. The trenches are filled employing a gap filling silicon oxide dielectric trench fill layer. The trenches are separated by regions of differing widths causing the silicon oxide trench fill layer thicknesses over these differing width regions to be variable. The silicon oxide trench fill layer is then covered with a spin-on-glass (SOG) dielectric layer which minimizes the height differences in the silicon oxide layer underlying the spin-on-glass (SOG) layer. Thereafter, the substrate surface is planarized by etchback or chemical mechanical polish (CMP) planarizing methods.

Desirable within the art of microelectronics fabrication are methods for filling of trenches within substrates employed within microelectronics fabrications with trench fill layers while maintaining integrity of alignment marks formed within the substrate. Particularly desirable are methods for accomplishing this goal without additional photomask patterns and etch operations over and above the conventional photomask set required for the microelectronics fabrication.

It is toward the foregoing goals that the present invention is generally and specifically directed.

SUMMARY OF THE INVENTION

It is a first object of the present invention to provide a method for forming upon a substrate employed within a microelectronics fabrication a trench fill layer employed to fill trenches formed within the substrate.

It is a second object of the present invention to provide a method for forming in accord with the first object of the present invention within a trench within a substrate employed within a microelectronics fabrication a planarized trench fill dielectric layer while retaining integrity of an alignment mark also formed within the substrate.

It is a third object of the present invention to provide a method in accord with the first object of the present invention or the second object of the present invention for forming upon a patterned microelectronics layer upon a substrate employed within an integrated circuit microelectronics fabrication a planarized gap filling silicon oxide dielectric trench fill layer to fill trenches and cover features formed within the substrate while retaining alignment marks also formed within the patterned microelectronics layer It is a fourth object of the present invention to provide a method in accord with the first object of the present invention, the second object, of the present invention, and/or the third object of the present invention, which is readily commercially implemented.

In accord with the objects of the present invention, there is provided a method for forming a planarized surface of a trench fill layer employed to fill trenches formed within a substrate employed within a microelectronics fabrication while retaining alignment marks within the substrate. To practice the method of the invention, there is first provided a substrate employed within a microelectronics fabrication. There is then formed upon the substrate a series of trenches and alignment marks. There is then formed over the substrate a gap filling trench fill layer completely filling and covering over the trenches and alignment marks. There is then planarized the gap filling trench fill layer. There is then formed by photolithographic methods an etching mask pattern employing an oxide dielectric reverse-tone (ODR) mask with clearout etching windows over the alignment marks and over the large areas between trenches to allow the gap filling trench fill layer to be removed by selective etching, exposing once again the alignment marks and clearing the large areas of residual gap filling trench fill layer material.

The present invention employs methods and materials as are known in the art of microelectronics fabrication, but in a sequence which constitutes a novel arrangement of operations. Therefore, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 5, FIG. 6, FIG. 7, FIG. 8 and FIG. 9 show a series of schematic cross-sectional diagrams illustrating the results of forming upon a semiconductor substrate employed within an integrated circuit microelectronics fabrication in accord with a more specific embodiment of the method of the present invention a gap filling dielectric trench fill layer which, after filling trenches which may be formed independently from alignment marks also formed within the semiconductor substrate, is planarized by chemical mechanical polish (CMP) method. Subsequently, an oxide dielectric-layer reverse-tone (ODR) photomask and photolithographic processes are employed to etch the planarized trench fill dielectric layer away from over the alignment marks and from the oxide dielectric-layer areas in accord with a more specific method of the present invention.

DESCRIPTION OF THE PREFERRED EMBODIMENTS

The present invention provides a method for forming within a substrate employed within a microelectronics fabrication a gap filling trench fill layer to fill in isolation trenches and alignment marks which is then planarized. Subsequently, the oxide dielectric areas and the alignment mark areas are subtractively etched employing an oxide dielectric reverse-tone (ODR) pattern photomask and photolithographic methods and materials to regenerate the alignment marks and remove residual dielectric layer material from the oxide dielectric areas.

First Preferred Embodiment

Referring now to FIGS. 1 to 4, there is shown a series of schematic cross-sectional diagrams illustrating the results of forming upon a substrate employed within a microelectronics fabrication in accord with a general embodiment of the present invention which constitutes a first preferred embodiment of the present invention a gap filling trench fill layer which after filling isolation trenches and alignment marks within the substrate is then planarized. Subsequently, the gap filling trench fill layer material is subtractively etched from the alignment marks and large oxide dielectric areas employing a photomask pattern which is an oxide dielectric reverse-tone (ODR) photomask pattern and photolithographic methods and materials as are known in the art of microelectronics fabrication.

Figure 1:
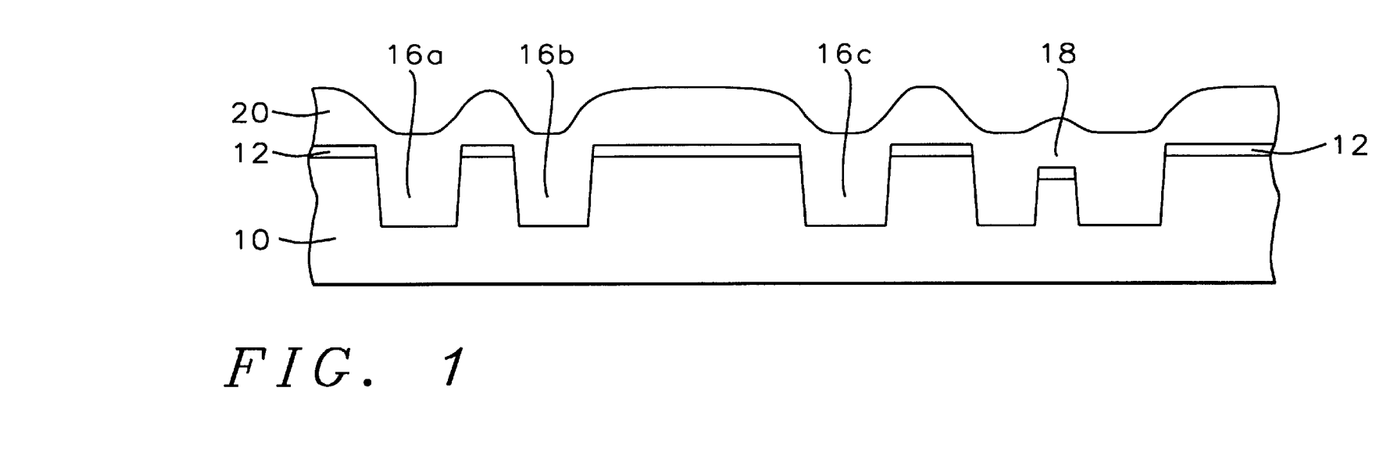
FIG. 1, FIG. 2, FIG. 3, and FIG. 4 show a series of schematic cross-sectional diagrams illustrating the results of forming within a substrate employed within a microelectronics fabrication in accord with a general embodiment of the method of the present invention a trench fill layer which after filling of shallow isolation trenches and alignment marks is planarized by chemical mechanical polish (CMP) method. Subsequently, an oxide dielectric-layer reverse-tone (ODR) photomask and photolithographic processes are employed to subtractively etch the planarized trench fill layer away over the alignment marks and the oxide dielectric-layer areas in accord with the general method of the present invention.

Referring now particularly to FIG. 1, there is shown a schematic cross-section of a microelectronics fabrication at an early stage in its fabrication in accord with the first embodiment of the method of the present invention. Shown in FIG. 1 is a substrate 10 covered with a pad oxide silicon oxide dielectric layer 12. A series of shallow isolation trenches 16a, 16b and 16c and a previously formed alignment mark region 18 are shown selectively etched into the substrate 10. A gap filling trench fill layer 20 is shown formed over and above the substrate 10.

The method of the present invention employs a substrate employed within a microelectronics fabrication which may include but is not limited to an integrated circuit microelectronics fabrication, a charge coupled device microelectronics fabrication, a solar cell array microelectronics fabrication, a ceramics substrate microelectronics fabrication, or a flat panel display microelectronics fabrication. With respect to the substrate 10 shown in FIG. 1, the substrate 10 is the substrate itself or any of several microelectronics layers formed upon the substrate 10. Preferably, the substrate 10 is a silicon semiconductor substrate of either p- or n-type dopant polarity.

With respect to the pad oxide silicon oxide dielectric layer 12 shown in FIG. 1, the pad oxide silicon oxide layer 12 may be formed by methods and materials known in the art of microelectronics fabrication including but not limited to thermal oxidation, chemical vapor deposition (CVD), plasma enhanced chemical vapor deposition (PECVD) and physical vapor deposition (PVD) sputtering methods. Preferably, the pad oxide layer 12 is formed employing thermal oxidation of silicon. Preferably, the silicon oxide pad oxide layer 12 is formed to a thickness of from about 90 to about 130 angstroms.

With respect to the shallow trenches 16a, 16b and 16c and the alignment mark region 18, the trenches 16a, 16b and 16c and the alignment mark region 18 may be formed by selective etching employing photolithographic methods and materials and anisotropic etching methods as are known in the art of semiconductor microelectronics fabrication. Alternatively, although not shown in FIG. 1, the trenches 16a, 16b and 16c and the alignment mark region 18 may be formed simultaneously as well as the alignment mark region having been formed prior to formation of the pad oxide silicon oxide layer 12.

With respect to the gap filling trench fill layer 20, the gap filling trench fill layer 20 may be formed by methods and materials as are known in the art of microelectronics fabrications, including but not limited to chemical vapor deposition (CVD), plasma enhanced chemical vapor deposition (PECVD), spin-on-glass and physical vapor deposition (PVD) sputtering methods. Preferably, the gap filling trench fill layer 20 is formed employing high density plasma chemical vapor deposition (HDP-CVD) method to form a gap filling silicon oxide dielectric layer in accord with the following procedure: (1) top reactor chamber gas flow rates for argon, oxygen and silane of about 16, about 35 and about 16 standard cubic centimeters per minute (sccm) respectively; (2) side reactor chamber gas flow rates for argon, oxygen and silane of about 110, about 233 and about 116 standard cubic centimeters per minute (sccm) respectively; (3) top source power of about 1300 watts; (4) side source power of about 3100 watts; (5) bias power of about 3000 watts; (6) radio frequency of 13.56 mHz; and (7) substrate temperature of about 400 degrees centigrade.

Figure 2:
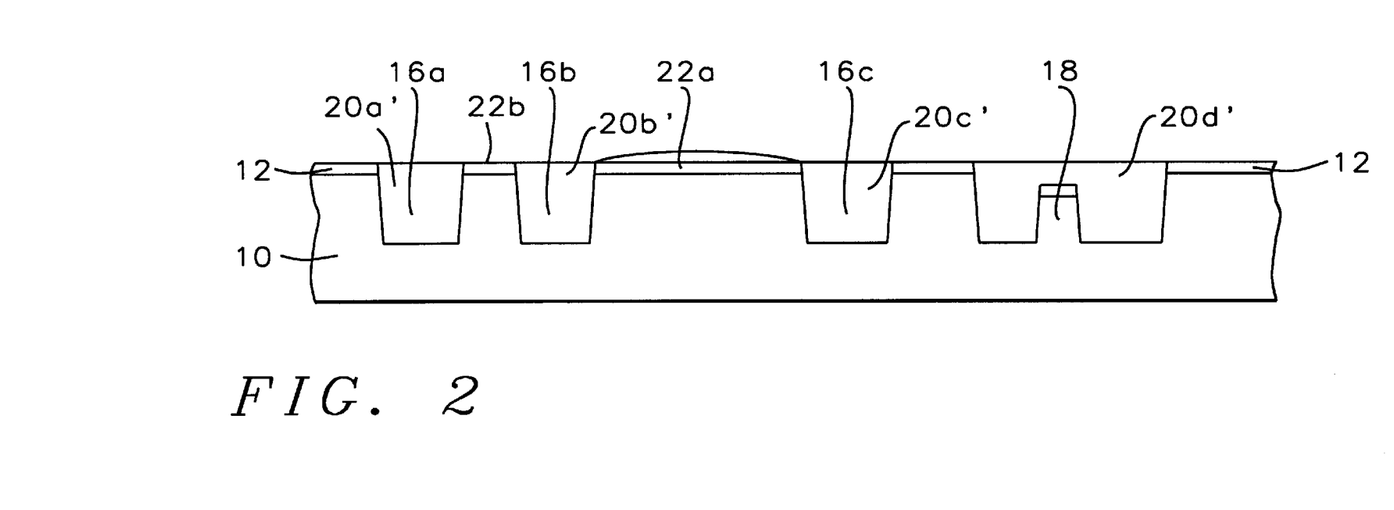

Referring now particularly to FIG. 2, there is shown a schematic cross-sectional diagram illustrating the results of further processing of the microelectronics fabrication whose schematic cross-sectional diagram is shown in FIG. 1 in accord with the first preferred embodiment of the method of the present invention. Shown in FIG. 2 is a microelectronics fabrication otherwise equivalent to the microelectronics fabrication shown in FIG. 1, but where there has been formed over and upon the gap filling trench fill layer 20 a planarized surface resulting in a residual trench fill layer 20a', 20b', 20c' and 20d', and a residual surface layer 21' over the large area 22a separating trenches and alignment mark regions whereas there is essentially no residual layer over the small trench separation areas 22b.

With respect to the residual trench fill layer 20a', 20b', 20c' and 20d' and the residual surface layer 21', the residual trench fill layer 20a', 20b', 20c' and 20d' may be formed employing the method of chemical mechanical polish (CMP) planarization as is known in the art of microelectronics fabrication, whereas the residual layer 21' is a consequence of such a planarization process over a relatively large area.

Figure 3:
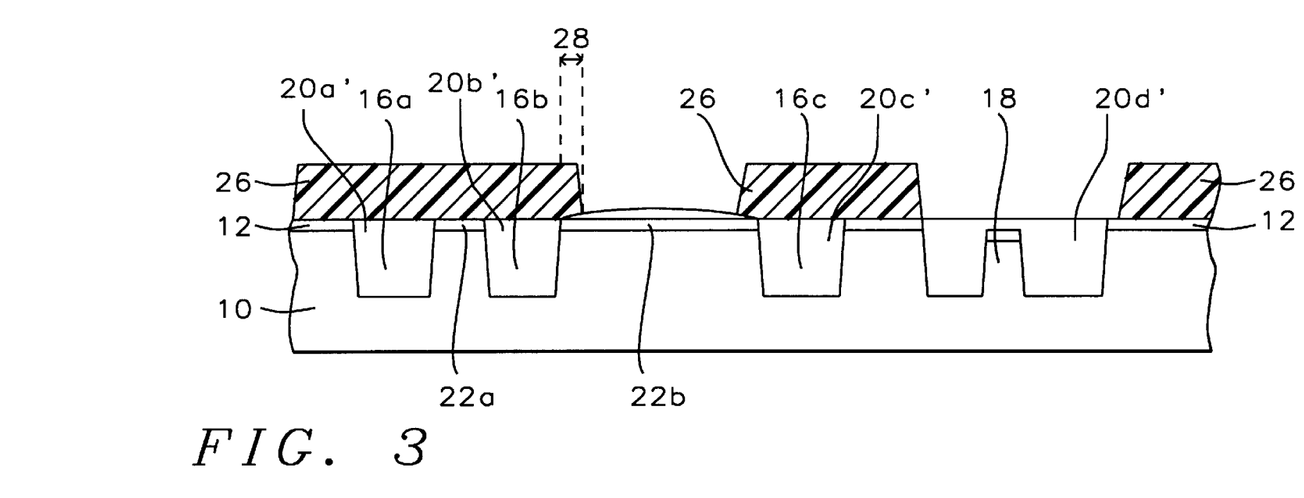

Referring now particularly to FIG. 3, there is shown a schematic cross-sectional diagram of a microelectronics fabrication illustrating the results of further processing of the microelectronics fabrication whose schematic cross-sectional diagram is shown in FIG. 2 in accord with the first preferred embodiment of the method of the present invention. Shown in FIG. 3 is a microelectronics fabrication otherwise equivalent to the microelectronics fabrication shown in FIG. 2, but where there has been formed a photoresist etch mask pattern 26 over the substrate. The photoresist etch mask pattern 26 has been formed employing an oxide dielectric-layer reverse-tone (ODR) pattern mask to expose a photoresist layer which has been processed by conventional photolithographic methods as are known in the art of microelectronics fabrication to produce the etching mask pattern 26. The photomask ODR pattern has incorporated into its design a dimensional bias 28 as shown in FIG. 3 to produce an exposed pattern opening in the photoresist mask which is slightly smaller than the oxide dielectric-layer dimension to protect the edges of the trenches during subsequent processing steps.

Figure 4:
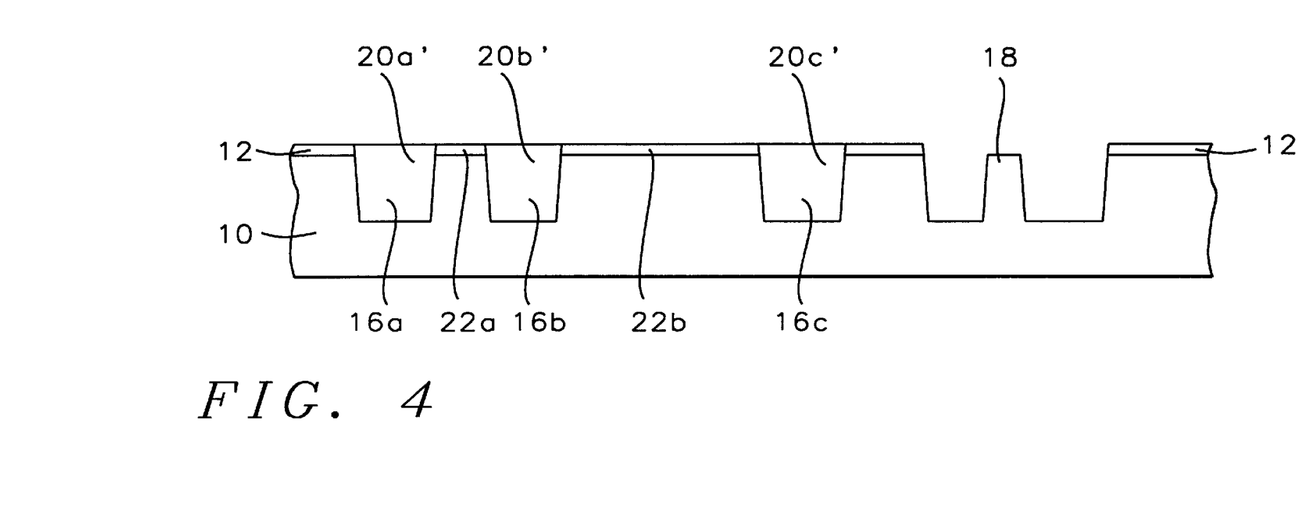

Referring now particularly to FIG. 4, there is shown a schematic cross-sectional diagram of a microelectronics fabrication illustrating the further results of processing of the microelectronics fabrication whose schematic cross-sectional diagram is shown in FIG. 3 in accord with the first preferred embodiment of the method of the present invention. Shown in FIG. 4 is a microelectronics fabrication otherwise equivalent to the microelectronics fabrication shown in FIG. 3, but wherein there has been etched away the exposed residual dielectric layer 21 remaining over the surface and the exposed trench fill residue layer 20d to uncover the alignment mark region 18. The photoresist mask 26 has been stripped away after the subtractive etching of the exposed regions of the silicon oxide dielectric layer 20', employing methods and materials as are known in the art of microelectronics fabrication.

An advantage of the method of the present invention is the protection of the vertical edge profiles of the shallow isolation trenches and alignment mark regions by the presence of the residual trench fill layer 20' during the chemical mechanical polish (CMP) planarization of the trench fill layer 20.

Second Preferred Embodiment

Referring now to FIGS. 5 to 9, there is shown a series of schematic cross-sectional diagrams illustrating the results of forming in accord with a more specific method of the present invention which is a second preferred embodiment of the present invention a gap filling dielectric trench fill layer to fill an isolation trench formed within a semiconductor substrate employed within an integrated circuit microelectronics fabrication wherein the semiconductor substrate has formed within it alignment marks formed independently from the isolation trench. Subsequently, the gap filling dielectric trench fill layer has been etched employing an oxide dielectric-layer reverse-tone (ODR) photomask and photolithographic processes away from the alignment marks and from the large area oxide dielectric-layer areas.

Figure 5:
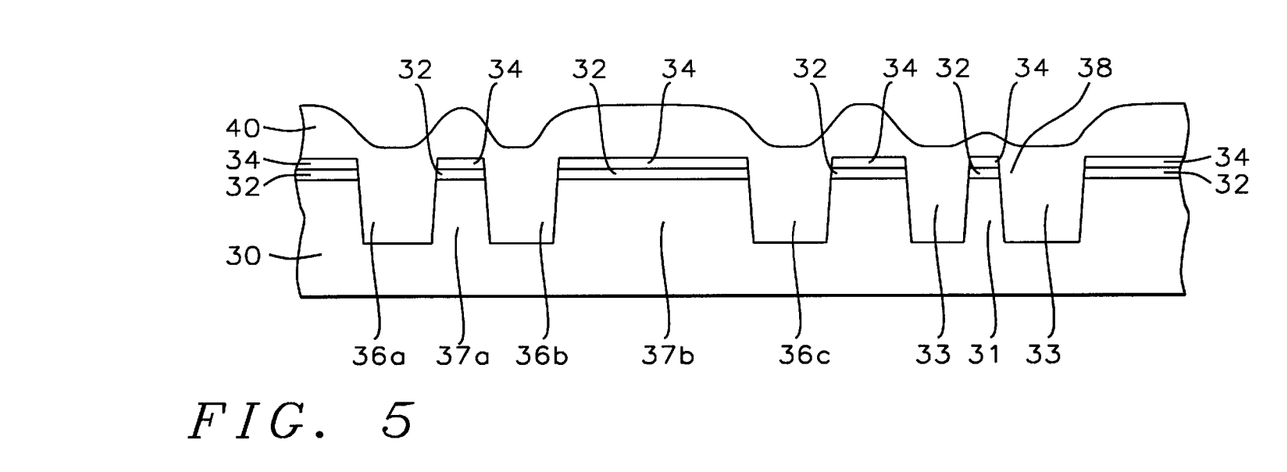

Referring now more particularly to FIG. 5, there is shown a schematic cross-sectional diagram illustrating a semiconductor integrated circuit microelectronics fabrication at an early stage in its fabrication in accord with the second preferred embodiment of the method of the present invention. Shown in FIG. 5 is an integrated circuit substrate 30 having previously formed alignment mark 31 formed in an alignment mark area 33. Silicon nitride layer 34 has been formed over a pad oxide silicon oxide layer 32 to form a masking layer through which trenches 36a, 36b and 36c have been formed in the substrate 30, forming a narrow mesa 37a between trenches 36a and 36b. A large area wide mesa 37b of the semiconductor substrate 30 between trenches 36b and 36c constitutes an active device region. A gap filling dielectric trench fill layer 40 has been formed over and upon the semiconductor substrate 30.

With respect to the semiconductor substrate 30, the semiconductor substrate 30 is preferably a silicon substrate which may be single crystalline, polycrystalline or amorphous in nature, of various crystalline orientations and of either N- or P-type polarity or undoped.

With respect to the pad oxide silicon oxide layer 32 shown in FIG. 5, the pad oxide silicon oxide layer 32 is equivalent or analogous to the silicon oxide layer 12 shown in FIG. 1. With respect to the silicon nitride etch stop layer 34, the silicon nitride etch stop layer 34 is formed employing chemical vapor deposition (CVD) as is known in the art of microelectronics fabrication. With respect to the trenches 36a, 36b and 36c and the alignment mark region 38 shown in FIG. 5, these may be formed analogous or equivalent to the trenches 16a, 16b and 16c and the alignment mark region 18 shown in FIG. 1. Preferably, the alignment mark region 38 is formed subsequent to formation of the pad oxide silicon oxide layer 32 and the silicon nitride etch stop layer 34. Although not shown in FIG. 5, the trenches 36a, 36b and 36c and the alignment mark region may be formed simultaneously, employing the silicon nitride layer 34 and the pad oxide layer 32 as the etching mask.

With respect to the gap filling silicon oxide dielectric trench fill layer 40 shown in FIG. 5, the gap filling silicon oxide trench fill layer 40 is formed analogous or equivalent to the preferred gap filling trench fill layer 20 shown in FIG. 1 of the first preferred embodiment of the method of the present invention.

Figure 6:
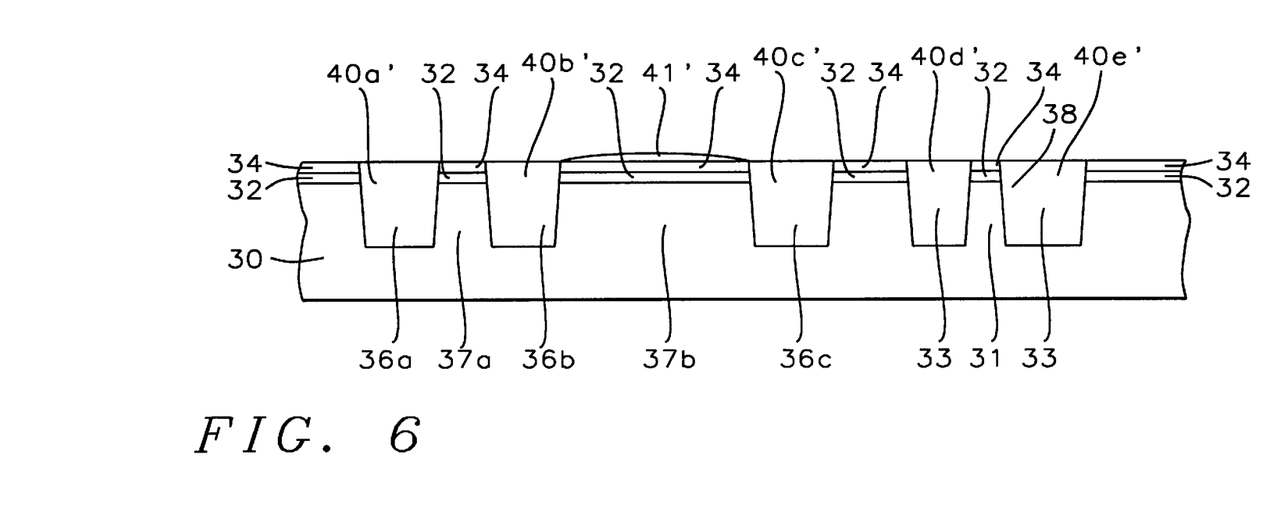

Referring now to FIG. 6, there is shown a schematic cross-sectional diagram illustrating the results of further processing of the integrated circuit microelectronics fabrication whose schematic cross-sectional diagram is shown in FIG. 5. Shown in FIG. 6 is an integrated circuit microelectronics fabrication otherwise equivalent to the integrated circuit microelectronics fabrication shown in FIG. 5, but wherein there has been planarized the gap filling silicon oxide trench fill layer 40, leaving a residual amount of silicon oxide layer 41 over the wide mesa 37b and filing the trenches 36a, 36b and 36c and the alignment mark region 38 with residual gap filling silicon oxide dielectric layer 40a', 40b', 40c', 40d' and 40e'.

With respect to the planarized surface show-n in FIG. 6, the surface has been planarized by methods conventional in the art of microelectronics fabrication analogous or equivalent to the chemical mechanical polish (CMP) polish planarization method employed as shown in FIG. 2 of the first preferred embodiment of the method of the present invention.

Figure 7:
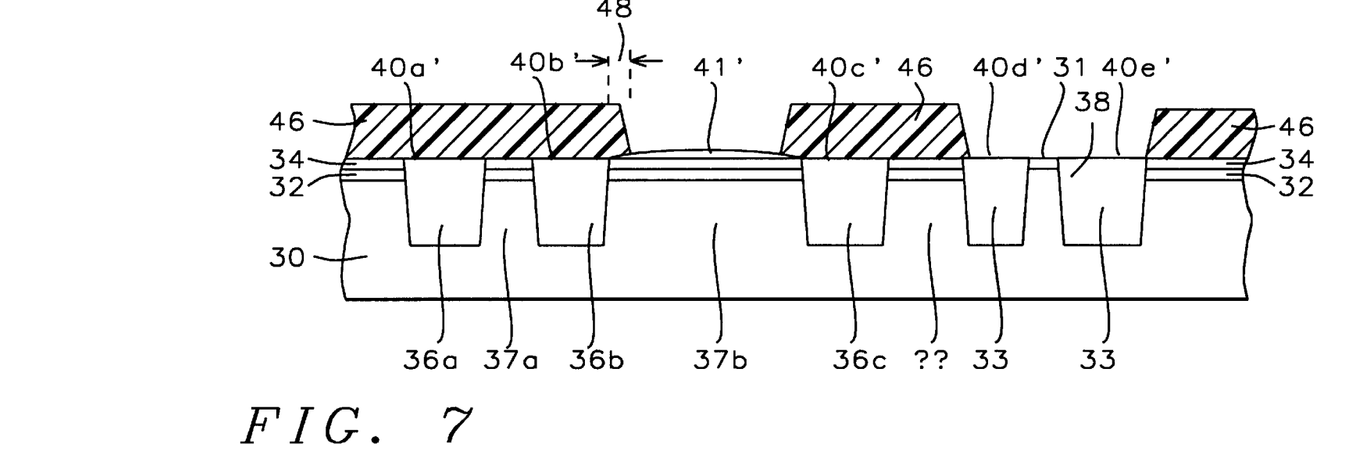

Referring now to FIG. 7, there is shown a schematic cross-sectional diagram illustrating the results of further processing of the integrated circuit microelectronics fabrication shown in FIG. 6. Shown in FIG. 7 is a schematic cross-sectional diagram of an integrated circuit microelectronics fabrication otherwise equivalent to the integrated circuit microelectronics fabrication shown in FIG. 6, but wherein there has been formed a photoresist etching mask pattern 46 employing conventional photolithographic methods and materials and an oxide dielectric-layer reverse-tone (ODR) photomask to expose the photoresist. The photoresist mask is formed with a bias 48 around the open areas to assure that the edges of the trenches 36a, 36b and 36c and the alignment mark region 38 are covered by the photoresist mask 46.

With respect to the photoresist mask pattern 46 shown in FIG. 7, the photoresist mask pattern is analogous or equivalent to the photoresist mask pattern 26 shown in FIG. 3 of the first preferred embodiment of the method of the present invention.

Figure 8:
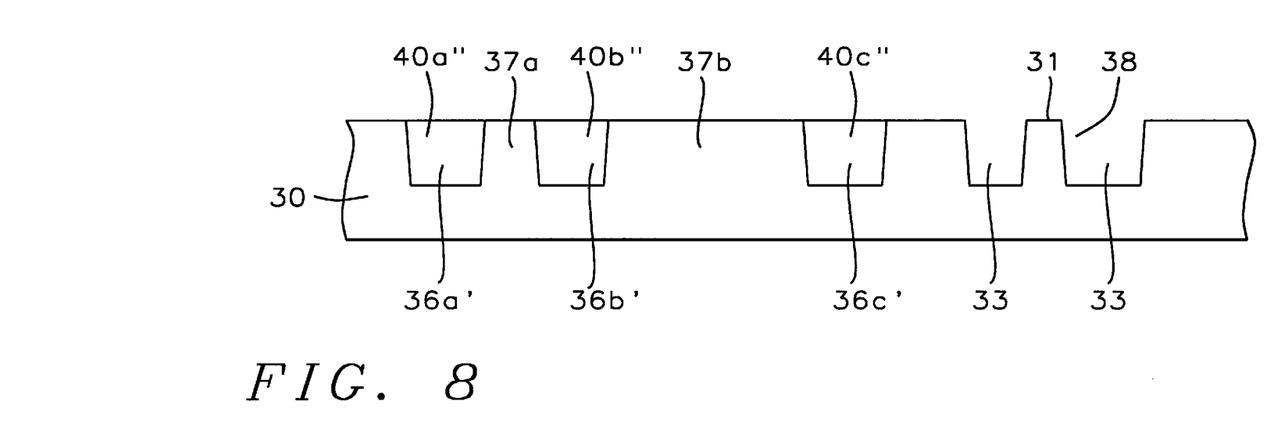

Referring now to FIG. 8, there is shown a schematic cross-sectional diagram illustrating the results of further processing of the integrated circuit microelectronics fabrication whose schematic cross-sectional diagram is shown in FIG. 7. Shown in FIG. 8 is an integrated circuit microelectronics fabrication otherwise equivalent to the integrated circuit microelectronics fabrication shown in FIG. 7, but wherein there has been etched away the exposed residual gap filling silicon oxide dielectric layer 41 and the exposed residual gap filling silicon oxide layer 40d' and 40e, uncovering the alignment mark 31. After subtractive etching of the exposed silicon oxide residual layer 40', there is subsequently stripped away the photoresist etching mask 46, employing methods and materials analogous or equivalent to the materials and methods shown in FIG. 4 of the first preferred embodiment of the method of the present invention.

Figure 9:
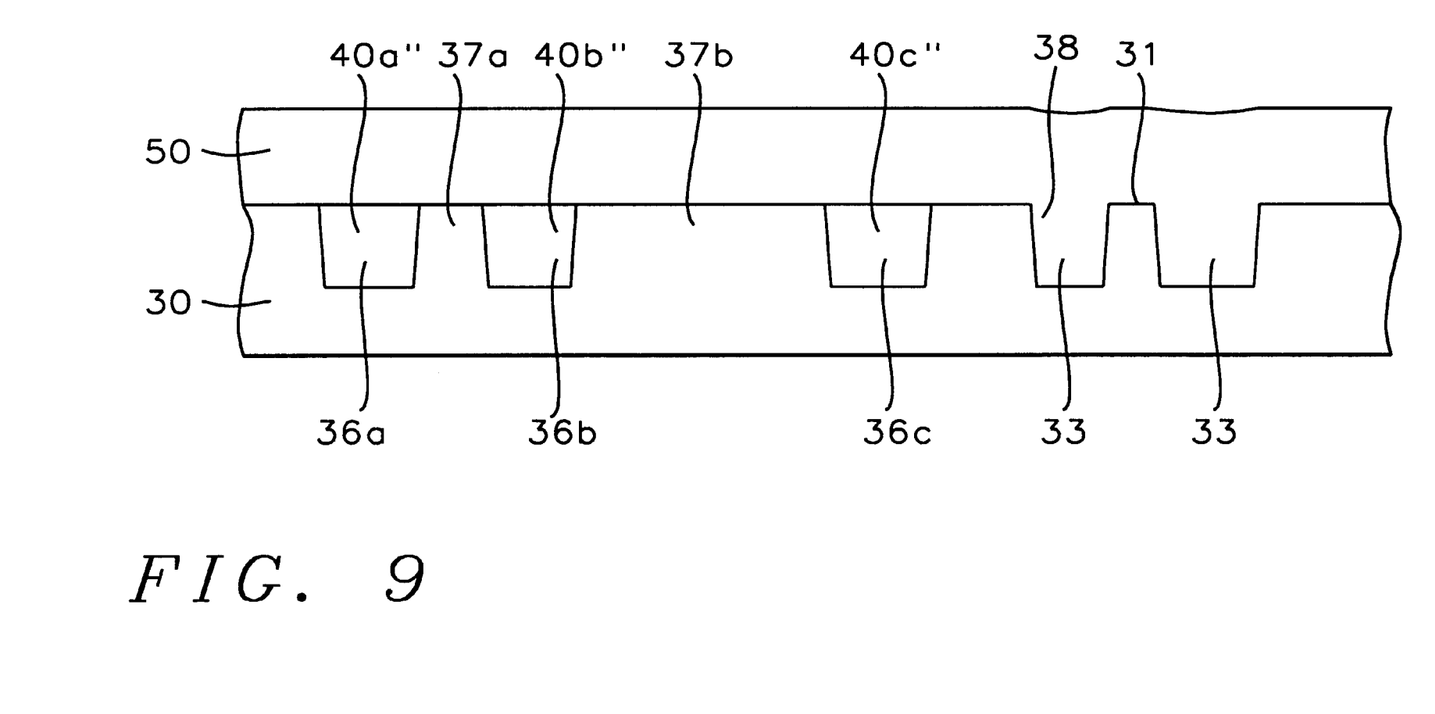

Referring now to FIG. 9, there is shown a schematic cross-sectional diagram illustrating the results of further processing of the integrated circuit microelectronics fabrication whose schematic cross-sectional diagram is shown in FIG. 8. Shown in FIG. 9 is an integrated circuit microelectronics fabrication otherwise equivalent to the integrated circuit microelectronics fabrication shown in FIG. 8, but wherein there has been formed over and upon the microelectronics substrate 30 a blanket microelectronics layer 50.

With respect to the blanket microelectronics layer 50 shown in FIG. 9, the blanket microelectronics layer 50 may be formed from a material chosen from the group including but not limited to microelectronics conductor materials, microelectronics semiconductor materials and microelectronics dielctric materials, employing methods known in the art of microelectronics fabrication including but not limited to thermal evaporation, electron beam assisted evaporation, chemical vapor deposition (CVD), plasma enhanced chemical vapor deposition (PECD), physical vapor deposition (PVD) sputtering, reactive sputtering, spin-on-polymer (SOP) and spin-on-glass (SOG) methods.

As is understood by a person skilled in the art, the preferred embodiments of the present invention are illustrative of the present invention rather than limiting of the present invention. Revisions and modifications may be made to materials, structures and dimensions through which is provided the preferred embodiments of the present invention while still providing embodiments which are within the spirit and scope of the present invention, as defined by the appended claims.

What is claimed is:

1. A method for forming within a trench within a substrate within a microelectronics fabrication a planarized trench fill layer comprising:
   providing a substrate;
   forming within the substrate:
     a series of trenches defined by at least one comparatively narrow mesa and at least one comparatively wide mesa; and
     at least one alignment mark;
   forming upon the substrate while filling the series of trenches, covering the narrow mesa, covering the wide mesa and covering the alignment mark a blanket trench fill layer;
   planarizing the blanket fill trench fill layer to:
     expose the surface of the narrow mesa;
     leave a first blanket trench fill layer residue at least partially covering the wide mesa; and
     leave a second blanket trench fill layer residue at least partially covering the alignment mark;
   forming an etching mask pattern upon the substrate to leave exposed at least a portion of the first blanket trench fill layer residue and the second blanket trench fill layer residue; and
   etching selectively the first blanket trench fill layer residue to expose the surface of the wide mesa and the second blanket trench fill layer residue to expose the alignment mark, said wide mesa and said alignment mark retaining their vertical edge profiles due to having been protected during planarization by the blanket trench fill layer residues.

2. The method of claim 1 wherein the substrate is a substrate employed within a microelectronics fabrication chosen from the group consisting of:
   an integrated circuit microelectronics fabrication;
   a charge coupled device array microelectronics fabrication;
   a solar cell array microelectronics fabrication;
   a ceramics substrate microelectronics fabrication; and
   a flat panel display microelectronics fabrication.

3. The method of claim 1 wherein the alignment mark is formed independently of and prior to forming the trench within the substrate.

4. The method of claim 1 wherein the blanket trench fill layer is a gap filling silicon oxide dielectric trench fill layer formed employing the method of high density plasma chemical vapor deposition (HDP-CVD).

5. The method of claim 1 wherein the etching mask pattern is formed employing an oxide dielectric-layer reverse-tone (ODR) mask to expose a photoresist layer to form the etching mask pattern and conventional photolithographic methods and materials to etch the pattern.

6. A method for forming upon a semiconductor substrate employed within an integrated circuit microelectronics fabrication a planarized gap filling silicon oxide trench fill layer comprising:
   providing a semiconductor substrate;
   forming within the substrate at least one alignment mark;
   forming upon the semiconductor substrate a composite dielectric layer;
   forming within the semiconductor substrate a series of trenches defined by at least one comparatively narrow mesa and at least one comparatively wide mesa;
   forming upon the semiconductor substrate while filling the series of trenches, covering the narrow mesa, covering the wide mesa and covering the alignment mark a blanket gap filling trench fill layer;
   planarizing the blanket gap filling, trench fill layer to:
     expose the surface of the narrow mesa,
     leave a first gap filling trench fill layer residue at least partially covering the wide mesa,
     leave a second blanket gap filling trench fill layer residue at least partially covering the alignment mark;
   forming an etching mask layer upon the semiconductor substrate to leave exposed at least a portion of the first blanket gap filling trench fill layer residue and the second blanket gap filling trench fill layer residue;
   etching selectively the first blanket gap filling trench fill layer residue to expose the surface of the wide mesa and the second blanket gap filling trench fill layer residue to expose the alignment mark, said wide mesa and said alignment mark retaining their vertical edge profiles due to having been protected by said blanket said filling trench fill layer residues during planarization; and
   forming a blanket microelectronics layer upon and over the semiconductor substrate.

7. The method of claim 6 wherein a planar surface is formed upon the gap filling silicon oxide trench fill layer employing a chemical mechanical polish (CMP) planarizing method.

8. The method of claim 6 wherein the semiconductor substrate is a silicon semiconductor substrate.

9. The method of claim 6 wherein the composite dielectric layer through which the shallow isolation trenches and alignment mark regions have been selectively etched is formed from a first pad oxide layer of silicon oxide on the semiconductor substrate and a second etch stop layer of silicon nitride formed upon the first pad oxide silicon oxide layer.

10. The method of claim 9 wherein the silicon oxide pad oxide layer is formed employing thermal oxidation of silicon.

11. The method of claim 10 wherein the silicon oxide pad oxide layer is formed to a thickness of from 90 to 130 angstroms.

12. The method of claim 9 wherein the etch stop silicon nitride layer is formed employing a chemical vapor deposition (CVD) method.

13. The method of claim 12 wherein the silicon nitride etch stop layer is formed to a thickness of from 1000 to 2000 angstroms.

14. The method of claim 6 wherein the gap filling silicon oxide dielectric trench fill layer is formed employing high density plasma chemical vapor deposition (HDP-CVD) method.

15. The method of claim 6 wherein the gap filling silicon oxide dielectric trench fill layer surface is planarized employing a chemical mechanical polish (CMP) planarizing method.

16. The method of claim 6 wherein the gap filling silicon oxide dielectric layer is selectively etched from the oxide dielectric-layer regions employing an etching pattern mask formed employing an oxide dielectric reverse-tone (ODR) mask to expose a photoresist layer and conventional photolithographic methods and materials to develop and etch the pattern in the silicon oxide dielectric layer.

17. The method of claim 6 wherein the blanket microelectronics layer is selected from the group consisting of:

microelectronics conductor layers;

microelectronics semiconductor layers; and microelectronics dielectric layers.

* * * * *